United States Patent

Taguchi et al.

[11] Patent Number: 6,107,899
[45] Date of Patent: Aug. 22, 2000

[54] SURFACE ACOUSTIC WAVE FILTER WITH GROUNDS NOT CONNECTED IN THE PACKAGE OR ON THE PIEZOELECTRIC SUBSTRATE

[75] Inventors: Yutaka Taguchi, Takatsuki; Kazuo Eda, Nara; Keiji Onishi, Settsu; Shunichi Seki, Amagasaki, all of Japan

[73] Assignee: Matsushita Electric Industrial Co., Ltd., Osaka, Japan

[21] Appl. No.: 08/955,298

[22] Filed: Oct. 21, 1997

[30] Foreign Application Priority Data

Oct. 21, 1996 [JP] Japan .................................. 8-277951
Oct. 25, 1996 [JP] Japan .................................. 8-283484

[51] Int. Cl.$^7$ .................................................. H03H 9/64
[52] U.S. Cl. ........................................ 333/193; 310/313 B
[58] Field of Search ............................ 333/193–196; 310/313 R, 313 B, 313 C, 313 D

[56] References Cited

U.S. PATENT DOCUMENTS

| | | | |
|---|---|---|---|
| 4,365,219 | 12/1982 | Nathan .................................. | 333/193 |
| 5,237,235 | 8/1993 | Cho et al. ............................ | 310/313 R |
| 5,506,552 | 4/1996 | Seki et al. ........................... | 333/194 X |
| 5,559,481 | 9/1996 | Satoh et al. .......................... | 333/194 X |
| 5,561,406 | 10/1996 | Ikata et al. .......................... | 333/193 X |
| 5,874,869 | 2/1999 | Ueda et al. ........................... | 333/193 |
| 5,945,893 | 8/1999 | Plessky et al. ....................... | 333/193 X |

FOREIGN PATENT DOCUMENTS

| | | | |
|---|---|---|---|
| 52-019044 | 2/1977 | Japan . | |
| 58-154917 | 9/1983 | Japan . | |
| 61-230419 | 10/1986 | Japan . | |
| 01231417 | 9/1989 | Japan . | |
| 03222512 | 10/1991 | Japan . | |
| 04033405 | 2/1992 | Japan . | |
| 5-55872 | 3/1993 | Japan ................................. | 333/193 |
| 6-97757 | 4/1994 | Japan ................................. | 333/193 |
| 6-164309 | 6/1994 | Japan ................................. | 333/193 |

*Primary Examiner*—Robert Pascal
*Assistant Examiner*—Barbara Summons
*Attorney, Agent, or Firm*—Smith, Gambrell & Russell, LLP

[57] ABSTRACT

A high-frequency surface acoustic wave filter is such that a plurality of comb electrodes are formed on a piezoelectric substrate, and said high-frequency surface acoustic wave filter has:

said piezoelectric substrate;

an input terminal;

an output terminal; and at least two ground terminals provided on said piezoelectric substrate, wherein said ground terminals are neither connected on said piezoelectric substrate nor connected in a package containing said piezoelectric substrate.

7 Claims, 20 Drawing Sheets

Fig. 26A
PRIOR ART
Fig. 26B
PRIOR ART
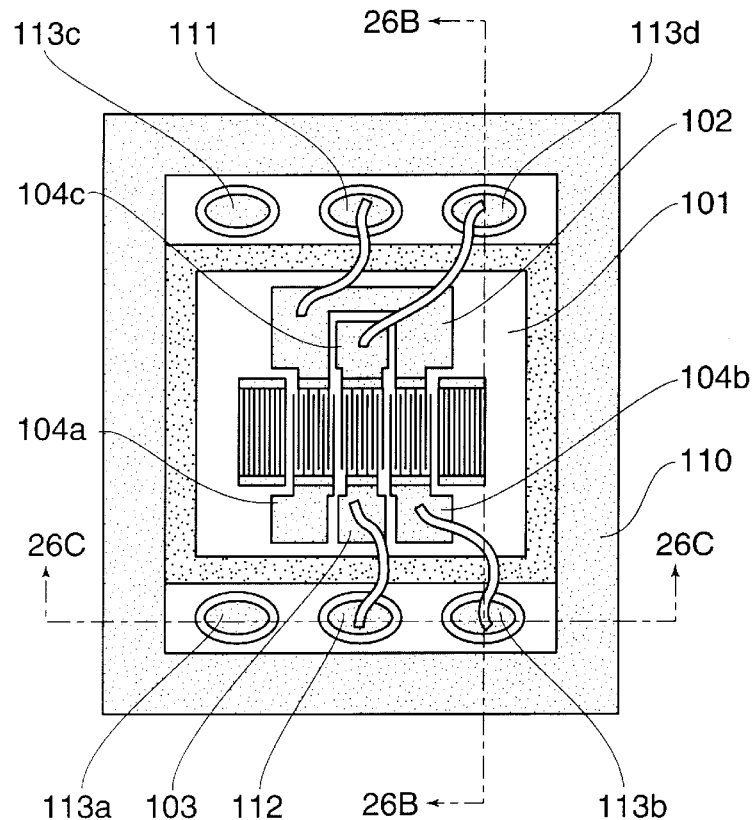
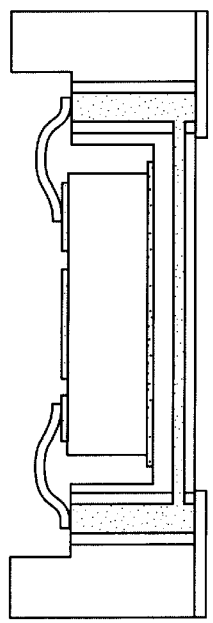
Fig. 26C
PRIOR ART
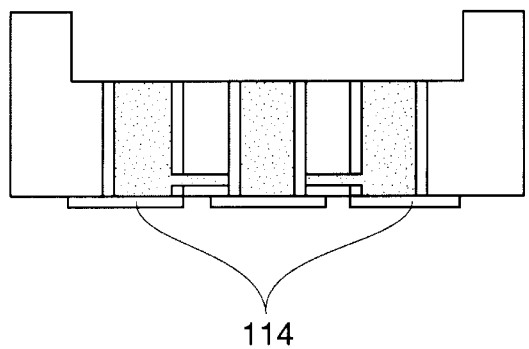

SURFACE ACOUSTIC WAVE FILTER WITH GROUNDS NOT CONNECTED IN THE PACKAGE OR ON THE PIEZOELECTRIC SUBSTRATE

BACKGROUND OF THE INVENTION

1. Field of the Invention

The present invention relates to a high-frequency filter, and more particularly, to a surface acoustic wave filter used in the high-frequency region.

2. Related Art of the Invention

In recent years, research has been earnestly carried out on surface acoustic wave devices for use as filters. Because of the recent development of mobile communication and the increase in frequency used for mobile communication, the development of surface acoustic wave devices, particularly, surface acoustic wave filters are actively worked on.

Conventionally, several methods have been known for forming a filter of the surface acoustic wave device in the high-frequency band, particularly, at several hundreds of MHz. Representative examples include one called a ladder type in which a filter is formed by use of a plurality of surface acoustic wave resonators as shown in Japanese Laid-open Patent Application S52-19044, one called a multi-electrode type as shown in Japanese Laid-open Patent Application S58-154917, a so-called longitudinal mode type in which surface acoustic wave resonators are adjacently disposed and the coupling between these resonators are used as shown in Japanese Laid-open Patent Applications Nos. H3-222512, S61-230419 and H1-231417.

Recently, with the development of mobile communication, the frequency band being used has been shifting to the quasi-microwave region. Previously, the characteristics of the surface acoustic wave filter depended on the electrode structure and the characteristics of the piezoelectric substrate. However, with the increase in frequency being used, other factors, particularly the influence of the parasitic capacitance and inductor cannot be disregarded at present. That is, because of the influence of the parasitic capacitance and inductor, it frequently occurs that the characteristics of the surface acoustic wave filter are different from expected characteristics.

For example, FIG. 24 shows calculated values of frequency characteristics of a three-electrode longitudinal-mode-type filter with a center frequency of 950 MHz using a LiNbO$_3$ board of 64-degree Y cut and X propagation as the piezoelectric substrate. An example in which this type of filter is formed according to a conventional structure is shown in FIG. 26. That is, FIG. 26 shows the structure of a conventional high-frequency surface acoustic wave filter in which as disclosed in Japanese Laid-open Patent Application No. H4-33405, in order to obtain a ground terminal being excellent even at high frequencies, two ground terminals are connected for commonality on a piezoelectric substrate 101 as shown at 104a and the common ground terminal is electrically connected to a single terminal 104c for commonality in a package. Since like elements are designated like reference numerals, the description of FIG. 1 applies. Measured characteristics of the filter of FIG. 26 are as shown in FIG. 25. As is apparent from FIG. 25, in the conventional structure, the out-of-band attenuation amount particularly disagrees with the calculated values of FIG. 24.

Moreover, even in filters for the same system, desired filter characteristics vary among users. If this demand is met with the conventional filter structure, the design becomes complicated because of the presence of complicated inductors. This renders the control of production and stock cumbersome. A cause of the complicated inductors is that the ground terminals 104a and 104b are connected for commonality on the piezoelectric substrate 101 and the ground terminal 104c is connected for commonality in the package 110 as shown in FIG. 26 (see the view taken on the line B–B').

FIG. 28 shows the conventional high-frequency surface acoustic wave filter. The ground terminals are common in the package and there are parasitic capacitances existing in the high-frequency surface acoustic wave filter.

SUMMARY OF THE INVENTION

In view of the above-mentioned problem of the conventional surface acoustic wave filter, it is an object of the present invention to provide a high-frequency surface acoustic wave filter having characteristics close to calculated values and realizing improved production accuracy.

It is another object of the present invention to provide filters realizing different desired out-of-band characteristics although having the same piezoelectric substrate and comb electrode designs.

We studied the influence of parasitic inductors existing in the high-frequency surface acoustic wave filter. Normally, examples of filters using the surface acoustic wave on the piezoelectric substrate include the longitudinal mode resonator type and the ladder type as mentioned above. In these types, an input terminal, an output terminal and a ground terminal are provide on the piezoelectric substrate, and the number of ground terminals is frequently two or more. Various examinations which we carried out show that filter characteristics frequently depend on the place where the ground terminals are connected to each other. We have found that a filter having characteristics closer to calculated values may be formed by connecting the ground terminals not on the piezoelectric substrate or in the package containing the piezoelectric substrate but on the circuit board where the filter is finally mounted.

We have also found that by doing so, conditions may be created in which inductors of different values are connected to the ground terminals and the control range may be increased for filters having the same piezoelectric substrate and comb electrode designs.

On the other hand, we studied the influence of the parasitic capacitance existing in the high-frequency surface acoustic wave filter, particularly, the capacitance existing between the signal lines and the ground terminals of the filter. The capacitance is mainly attributed to the structure of the package containing the piezoelectric. The capacitance is obtained by simulation and measurement. The match of the high-frequency surface acoustic wave filter with external circuits degrades as the capacitance increases, so that the ripple within the passband increases. Although it is ideal that the capacitance does not exist, it is virtually impossible that the capacitance is null even according to the present invention.

We have found that when the relationship between a pass center frequency F of the surface acoustic wave filter and a capacitance C existing between the signal lines (input and output terminals) and the ground terminals of the package is as follows [the pass center frequency F is in hertz (Hz) and the capacitance C is in farads (F) (when the parasitic capacitance differs between the input and output terminals, the greater one is used)]:

$1/(2\pi FC) > 130$, [Expression 1]

the in-band ripple is substantially within 1.5 dB, so that the characteristics are not greatly influenced.

A high-frequency surface acoustic wave filter of the present invention in which a plurality of comb electrodes are formed on a piezoelectric substrate, said high-frequency surface acoustic wave filter has:

said piezoelectric substrate;

an input terminal;

an output terminal; and at least two ground terminals provided on said piezoelectric substrate, wherein said ground terminals are neither connected on said piezoelectric substrate nor connected in a package containing said piezoelectric substrate.

A high-frequency surface acoustic wave filter of the present invention in which a plurality of comb electrodes are formed on a piezoelectric substrate, said high-frequency surface acoustic wave filter has;

said piezoelectric substrate;

an input terminal;

an output terminal; and at least two ground terminals provided on said piezoelectric substrate, wherein a part (A) of said ground terminals is neither connected on said piezoelectric substrate nor connected in a package containing said piezoelectric substrate, and a remainder (B) of said ground terminals is connected on said piezoelectric substrate or in said package, and wherein said part (A) includes a plurality of ground terminals and values of inductors respectively connected to said plurality of ground terminals are different from each other.

A method of the present invention is for manufacturing a high-frequency surface acoustic wave filter in which a plurality of comb electrodes are formed on a piezoelectric substrate, said high-frequency surface acoustic wave filter comprising said piezoelectric substrate, an input terminal, an output terminal and at least two ground terminals provided on said piezoelectric substrate, a part of said ground terminals being neither connected on said piezoelectric substrate nor connected in a package containing said piezoelectric substrate, a remainder of said ground terminals being connected on said piezoelectric substrate or in said package, wherein in forming said high-frequency surface acoustic wave filter, predetermined filter characteristics are obtained by adjusting values of inductors respectively connected to said ground terminals.

BRIEF DESCRIPTION OF THE DRAWINGS

FIG. 26A shows the structure of the conventional high-frequency surface acoustic wave filter.

FIG. 26B shows a cross-sectional view of the structure of the conventional high-frequency surface acoustic wave filter taken through the 26B—26B plane;

FIG. 26C shows a cross-sectional view of the structure of the conventional high-frequency surface acoustic wave filter taken through the 26C—26C plane;

DESCRIPTION OF THE REFERENCE NUMERALS

Figure 1A:
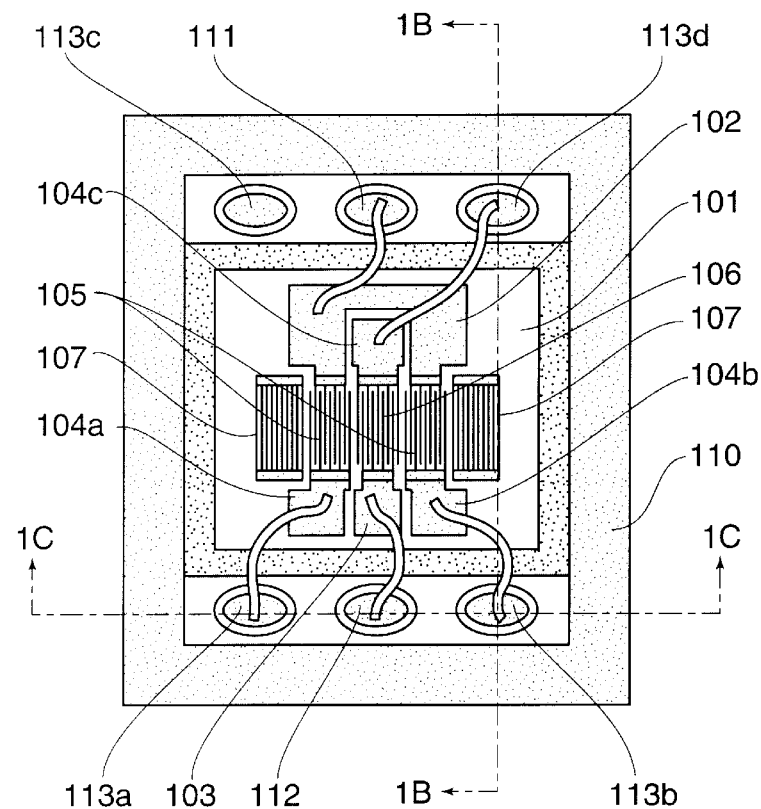
FIG. 1A shows the structure of a first embodiment of a high-frequency surface acoustic wave filter according to the present invention.

101 Piezoelectric substrate
102 Input terminal on the piezoelectric substrate
103 Output terminal on the piezoelectric substrate
104$a$, 104$b$, 104$c$, 104$d$ Ground terminals on the piezoelectric substrate
110 Package containing the piezoelectric substrate
111 Input terminal of the package
112 Output terminal of the package
113$a$, 113$b$, 113$c$, 113$d$ Ground terminals of the package
114 External ground terminal of the package

EMBODIMENTS OF THE INVENTION

Hereinafter, embodiments of the present invention will be described with reference to the drawings.
(First Embodiment)

Figure 1B:
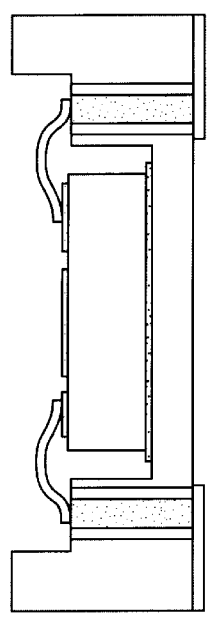
FIG. 1B shows a cross-sectional view of the first embodiment taken through the 1B—1B plane.
Figure 1C:
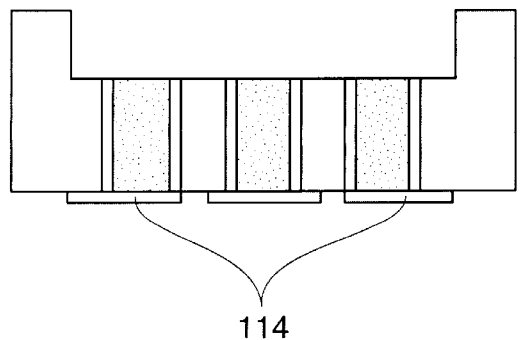
FIG. 1C shows a cross-sectional view of the first embodiment taken through the 1C—1C plane.

FIGS. 1A, FIG. 1B, and FIG. 1C show a first embodiment of a high-frequency surface acoustic wave filter according to the present invention. FIG. 1A is an internal structure view of the high-frequency surface acoustic wave filter. FIG. 1B is a cross-sectional view taken on the lines 1B—1B and of the internal structure view. FIG. 1C is a cross-sectional view taken on the line 1C—1C of the internal structure view. Reference numeral 101 represents a piezoelectric substrate. Reference numeral 102 represents an input terminal on the piezoelectric substrate. Reference numeral 103 represents an output terminal on the piezoelectric substrate. Reference numerals 104$a$ to 104$c$ represent ground terminals on the piezoelectric substrate. Reference numeral 110 represents a package including the piezoelectric substrate. Reference numeral 111 represents an input terminal of the package. Reference numeral 112 represents an output terminal of the package. Reference numerals 113$a$ to 113$d$ represent ground terminals of the package. Reference numeral 114 represents an external ground terminal of the package.

In this embodiment, a three-electrode longitudinal-mode-type high-frequency surface acoustic wave filter was formed by using an LiNbO$_3$ board of 64-degree Y cut and X propagation as the piezoelectric substrate 101. The three-electrode longitudinal-mode-type filter comprises an input comb electrode 105, an output comb electrode 106 and a reflector 107. The design of the portion of the three-electrode longitudinal-mode-type filter is the same as that of the conventional filter shown in FIG. 26A. In this embodiment, the ground terminals 104$a$ to 104$c$ on the piezoelectric substrate 101 are not connected on the piezoelectric substrate 101 but are connected to the ground terminals of the package 110 which are electrically independent. Consequently, when the filter is used, the ground terminals 104$a$ to 104$c$ of the high-frequency surface acoustic wave filter of this embodiment are connected through the external ground terminal 114 of the package 110 on a board where the filter is finally mounted.

With this structure, the area of the ground terminals is reduced because the ground terminals 104$a$ to 104$c$ are not connected in the package 110. Consequently, the inductor caused by the lines connecting the ground terminals does not exist and the common ground terminal which occupies a large area is not present unlike in the conventional package, so that the parasitic capacitance caused by the common ground terminal does not exist. As a result, the parasitic inductor and the parasitic capacitance associated with the ground terminals are minimized.

Figure 27:
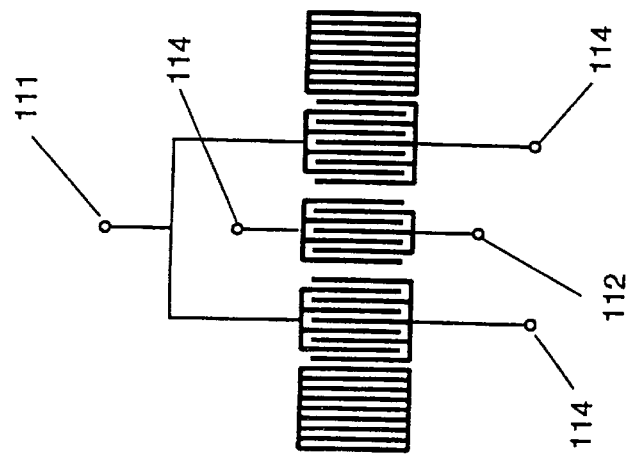
FIG. 27 shows a schematic illustration of the present high-frequency surface acoustic wave filter.

FIG. 27 is a schematic figure of the high-frequency surface acoustic wave filter. The ground terminals are independent in the package.

Figure 2:
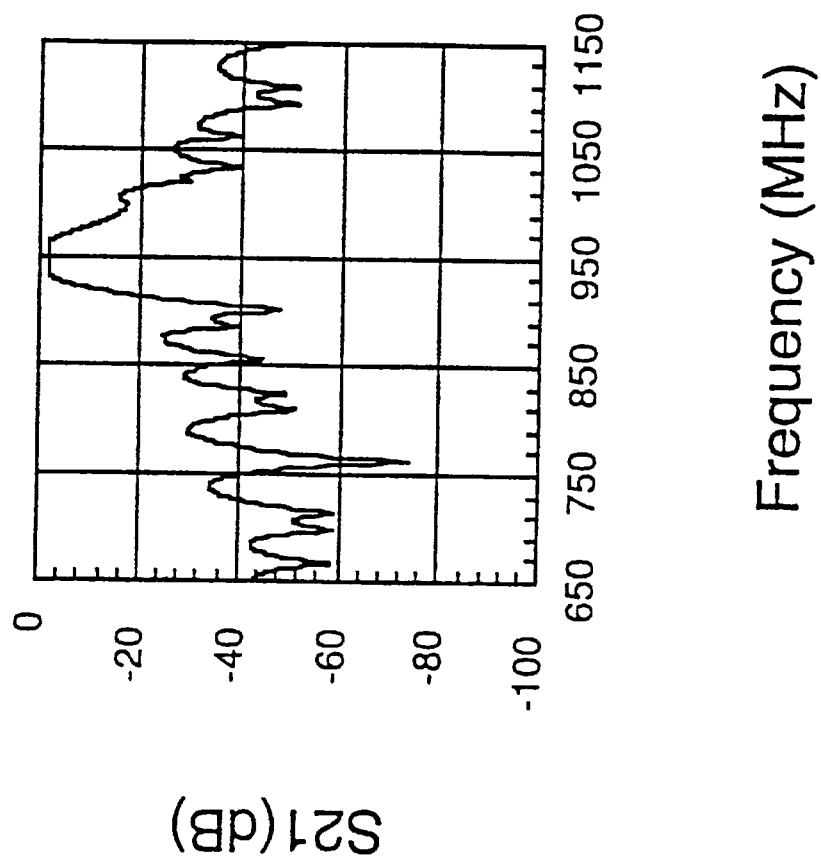
FIG. 2 shows frequency characteristics of the high-frequency surface acoustic wave filter in the first embodiment of the present invention.

FIG. 2 shows measured frequency characteristics of the high-frequency surface acoustic wave filter of this embodiment. Compared with the conventional high-frequency surface acoustic wave filter, the filter of this embodiment has improved out-of-band characteristics, and frequency characteristics agreeing with the design values are obtained.

As described above, according to the high-frequency surface acoustic wave filter of this embodiment, the parasitic inductor and the parasitic capacitance associated with the ground terminals are reduced. As a result, excellent frequency characteristics are obtained which agree with the design values.
(Second Embodiment)

Figure 3A:
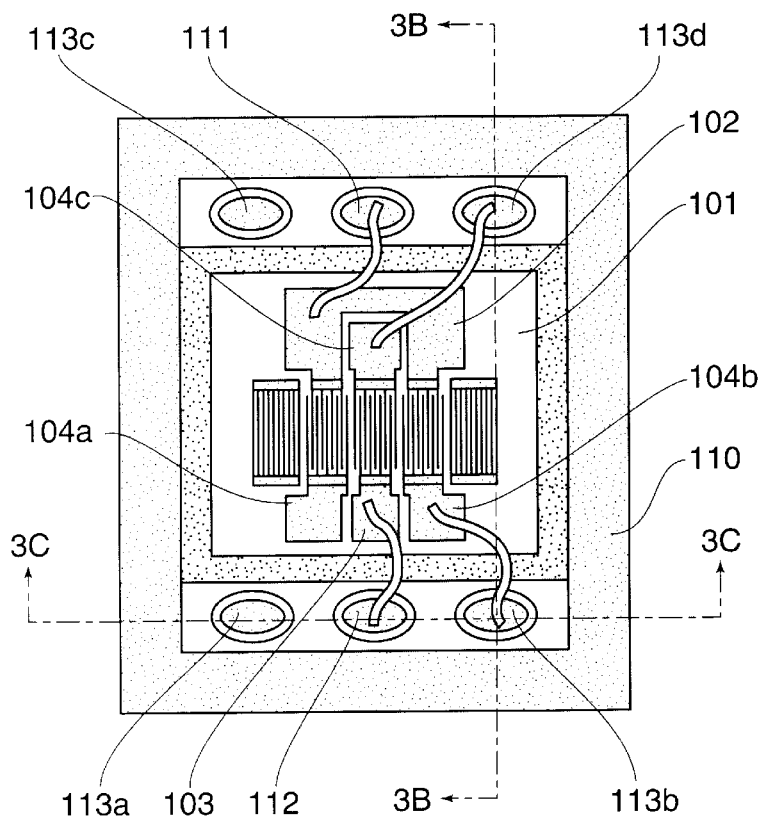
FIG. 3A shows the structure of a second embodiment of the high-frequency surface acoustic wave filter according to the present invention.
Figure 3B:
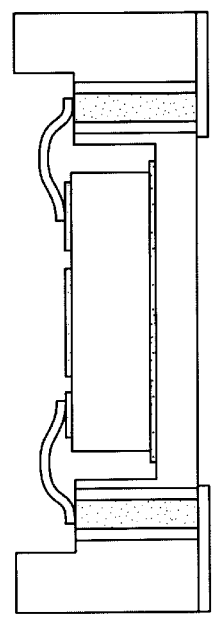
FIG. 3B shows a cross-sectional view of the second embodiment taken through the 3B—3B plane.
Figure 3C:
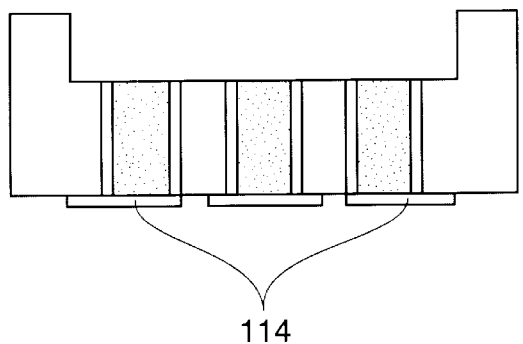
FIG. 3C shows a cross-sectional view of the second embodiment taken through the 3C—3C plane.
Figure 4:
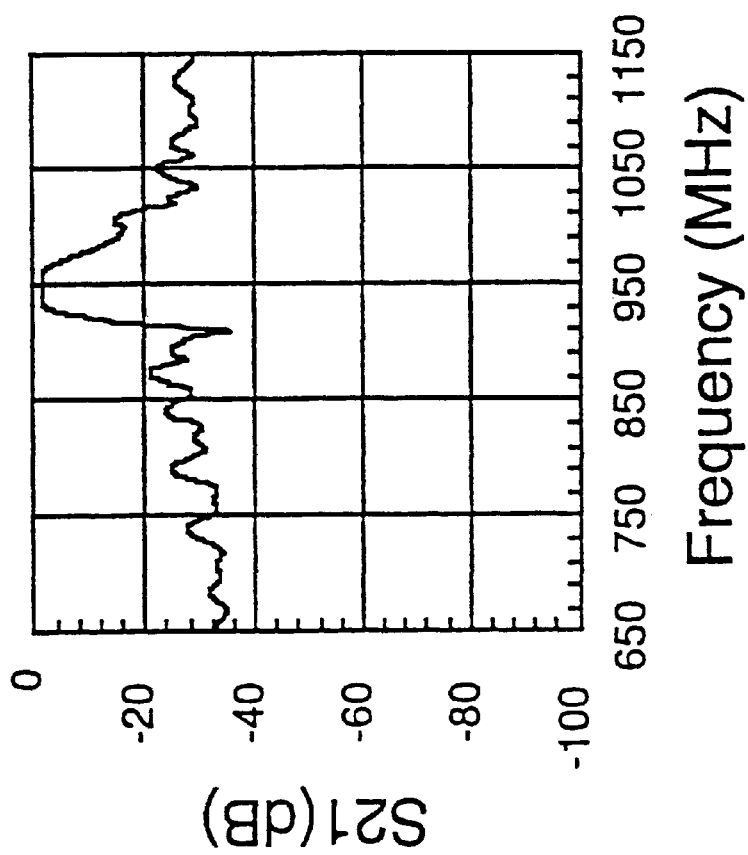
FIG. 4 shows frequency characteristics of the high-frequency surface acoustic wave filter in the second embodiment of the present invention.

FIG. 3A, FIG. 3B, and FIG. 3C show a second embodiment of the high-frequency surface acoustic wave filter according to the present invention. This embodiment is different from the first embodiment of FIG. 1A only in that the ground terminals 104$a$ and 104$b$ on the piezoelectric substrate 101 of FIG. 1A are connected on the piezoelectric substrate 101. Measured frequency characteristics of this embodiment are shown in FIG. 4. Compared with the first embodiment of FIG. 2, there is no big difference in characteristics except that the stopband outside the passband is slightly unclear.

Figure 5A:
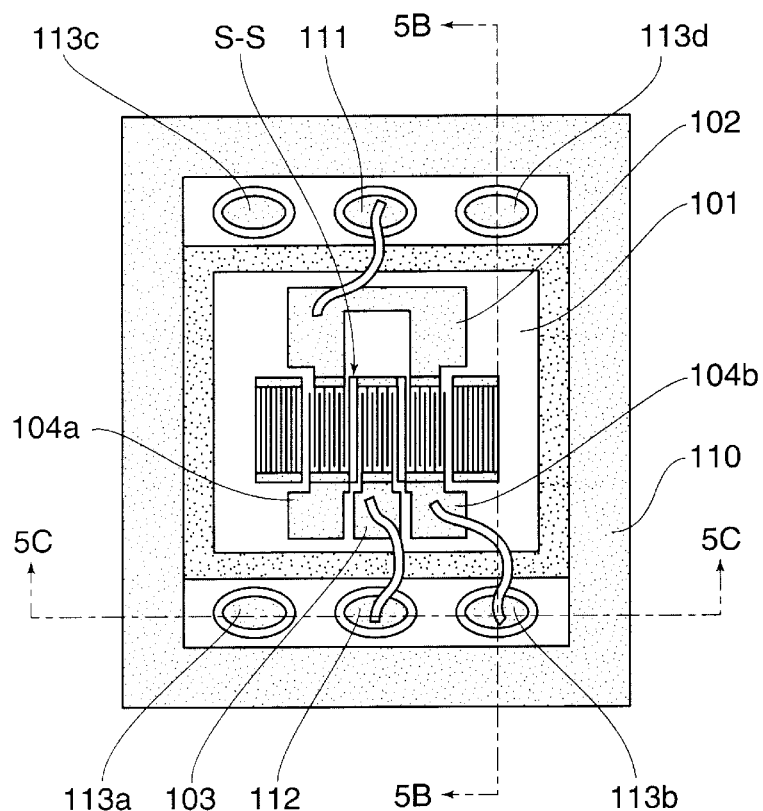
FIG. 5A shows the structure of a high-frequency surface acoustic wave filter in which the ground terminals on the piezoelectric substrate are all connected on the piezoelectric substrate.
Figure 5B:
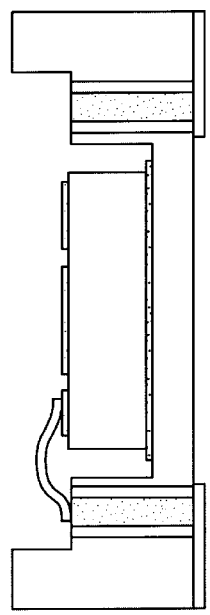
FIG. 5B shows a cross-sectional view of the structure of a high-frequency surface acoustic wave filter in which the ground terminals on the piezoelectric substrate are all connected on the piezoelectric substrate, taken through the 5B—5B plane.
Figure 5C:
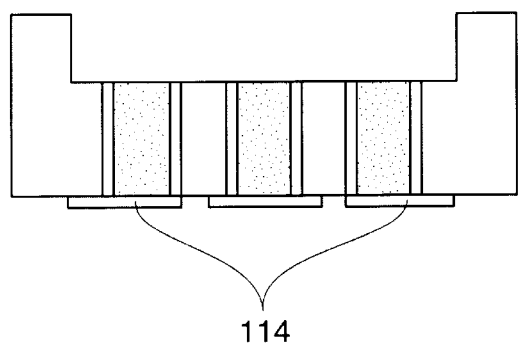
FIG. 5C shows a cross-sectional view of the structure of a high-frequency surface acoustic wave filter in which the ground terminals on the piezoelectric substrate are all connected on the piezoelectric substrate, taken through the 5C—5C plane.
Figure 6:
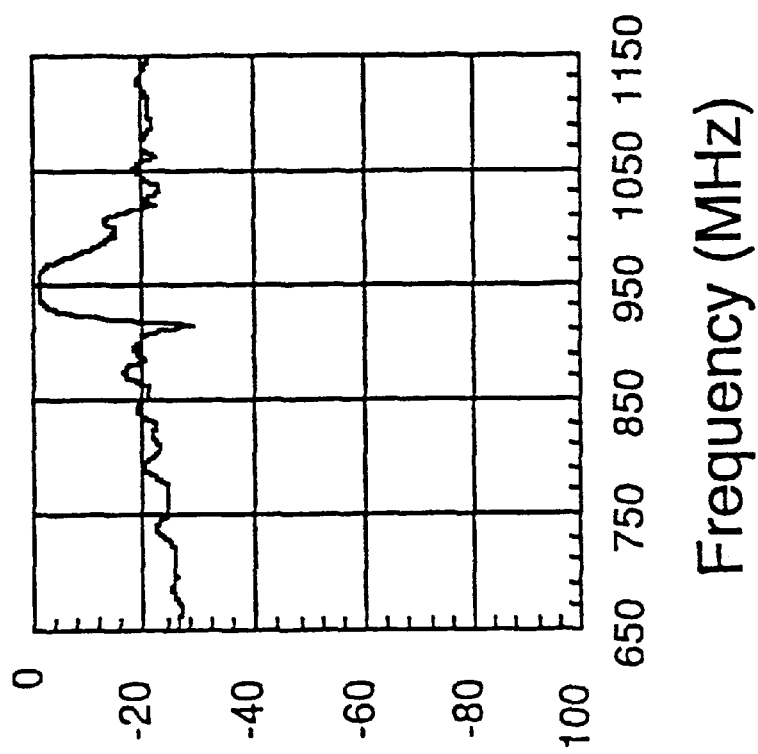
FIG. 6 shows frequency characteristics of the high-frequency surface acoustic wave filter in which the ground terminals on the piezoelectric substrate are all connected on the piezoelectric substrate.

For comparison, a filter was produced in which the ground terminals 104$a$, 104$b$ and 104$c$ on the piezoelectric substrate 101 of FIG. 1A were all connected for commonality as 101 shown in FIG. 5A. The ground terminal 104 of FIG. 1A is connected to the ground terminals 104$a$ and 104$b$ through a space between input and output comb electrodes S—S. Measured frequency characteristics of this filter are shown in FIG. 6. In this case, it is apparent that the out-of-band attenuation amount is vastly inferior to the calculated value.

This is because the connection for commonality causes the parasitic capacitance and the parasitic inductor as mentioned in the description of the prior art.

From the above, it is clear that in the three-electrode longitudinal-mode-type filter, the ground terminal of the input side comb electrode and the ground terminal of the output side comb electrode should be separated.

(Third Embodiment)

Figure 7:
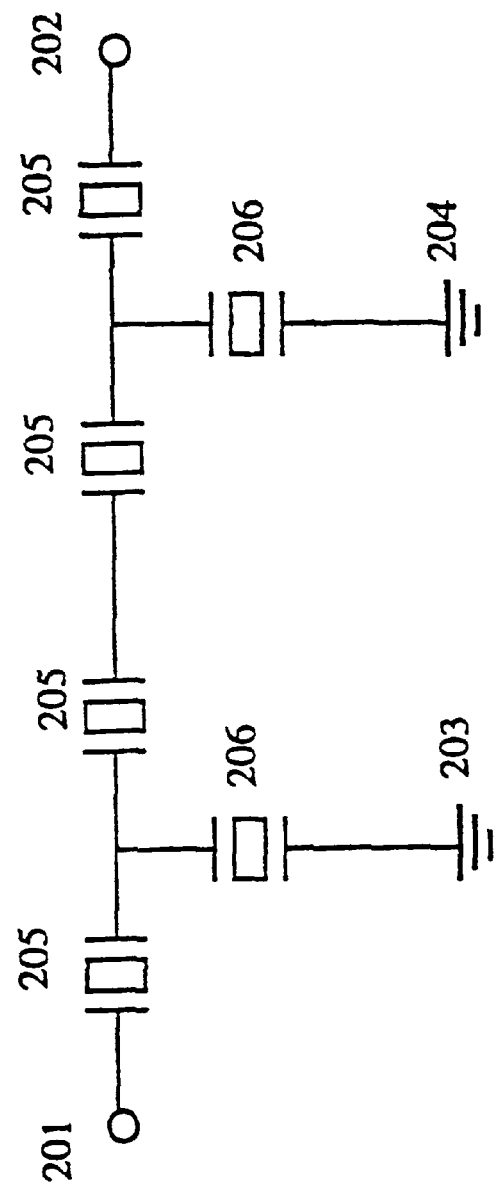
FIG. 7 shows the structure of a third embodiment of the high-frequency surface acoustic wave filter according to the present invention.

Next, a third embodiment of the present invention will be described. A ladder-type filter was formed by using LiTaO$_3$ of 36-degree Y cut and X propagation as the piezoelectric substrate. The structure of this filter is shown in FIG. 7. Reference numeral 201 represents an input terminal. Reference numeral 202 represents an output terminal. Reference numerals 203 and 204 represent ground terminals. Reference numeral 205 represents surface acoustic wave resonators connected in series. Reference numeral 206 represents surface acoustic wave resonators connected in parallel.

Figures 8, 9:
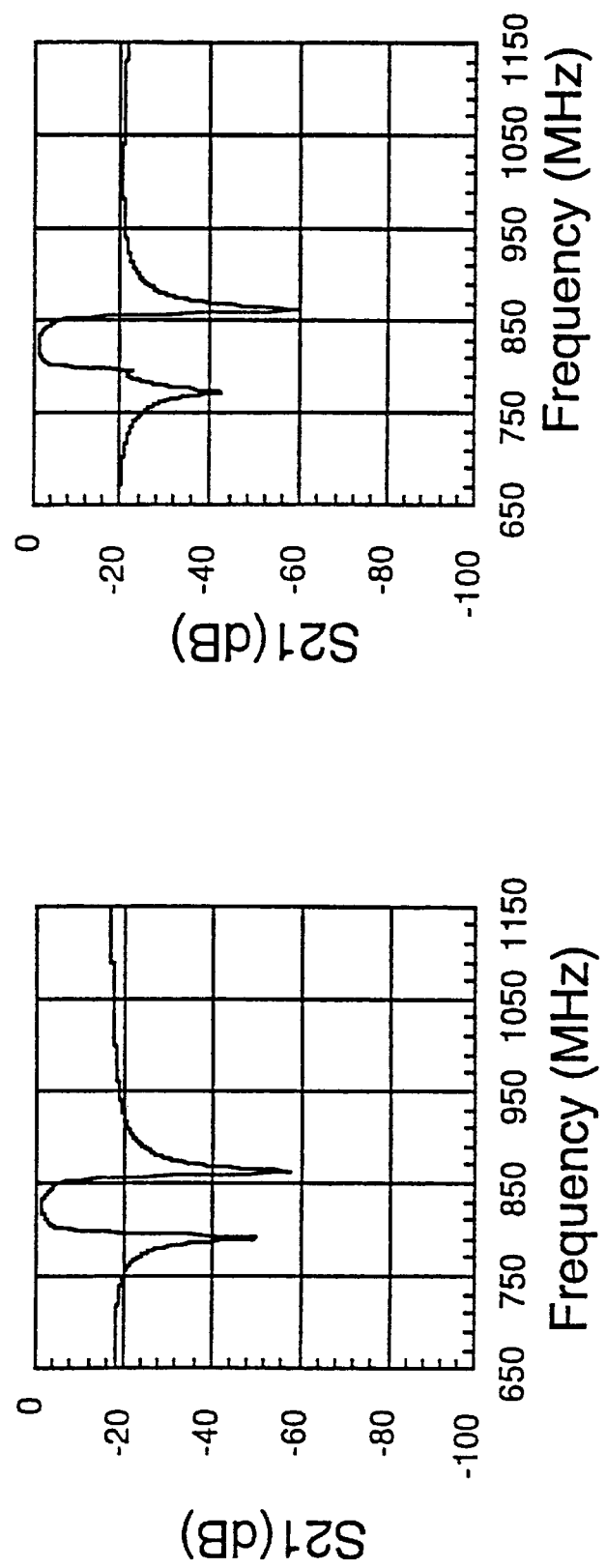
FIG. 8 shows theoretical frequency characteristics of the high-frequency surface acoustic wave filter in the third embodiment of the present invention.
FIG. 9 shows frequency characteristics of the high-frequency surface acoustic wave filter in the third embodiment of the present invention.

Theoretical characteristics of this filter are shown in FIG. 8. First, characteristics of a case where the ground terminals 203 and 204 are connected on the piezoelectric substrate are shown in FIG. 9. The out-of-band attenuation amount, particularly, that in a portion lower than the passband is greatly influenced.

Figure 10:
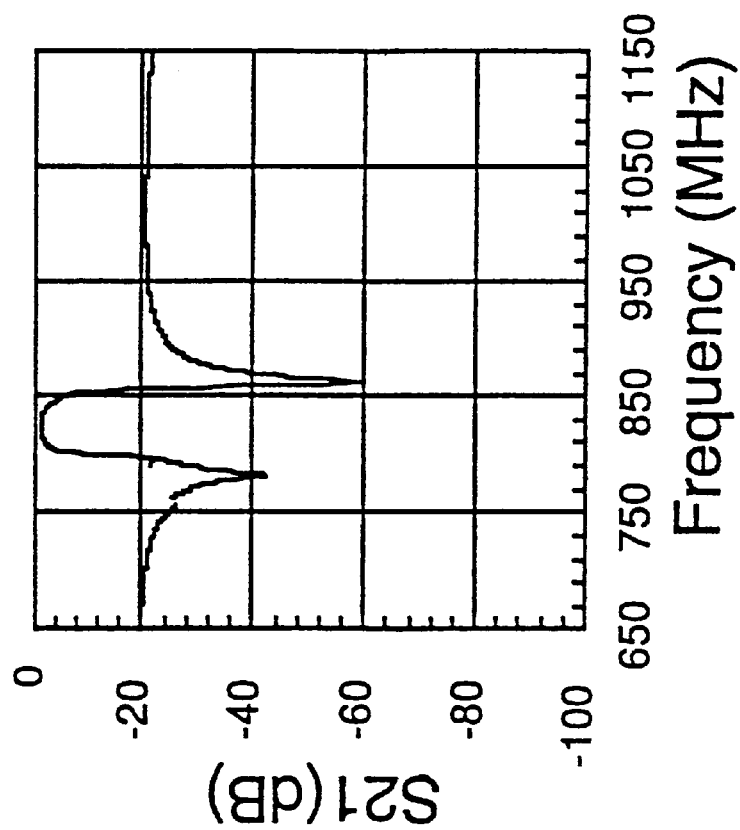
FIG. 10 shows frequency characteristics of the high-frequency surface acoustic wave filter in the third embodiment of the present invention.

Characteristics of a case where the ground terminals 203 and 204 are connected in the package containing the piezoelectric substrate are shown in FIG. 10. The out-of-band attenuation amount is still influenced although the influence is smaller than that in FIG. 9.

When the ground terminals 203 and 204 are connected on a finally mounted board outside the package, characteristics substantially the same as the calculated values were obtained.

(Fourth Embodiment)

Figure 11:
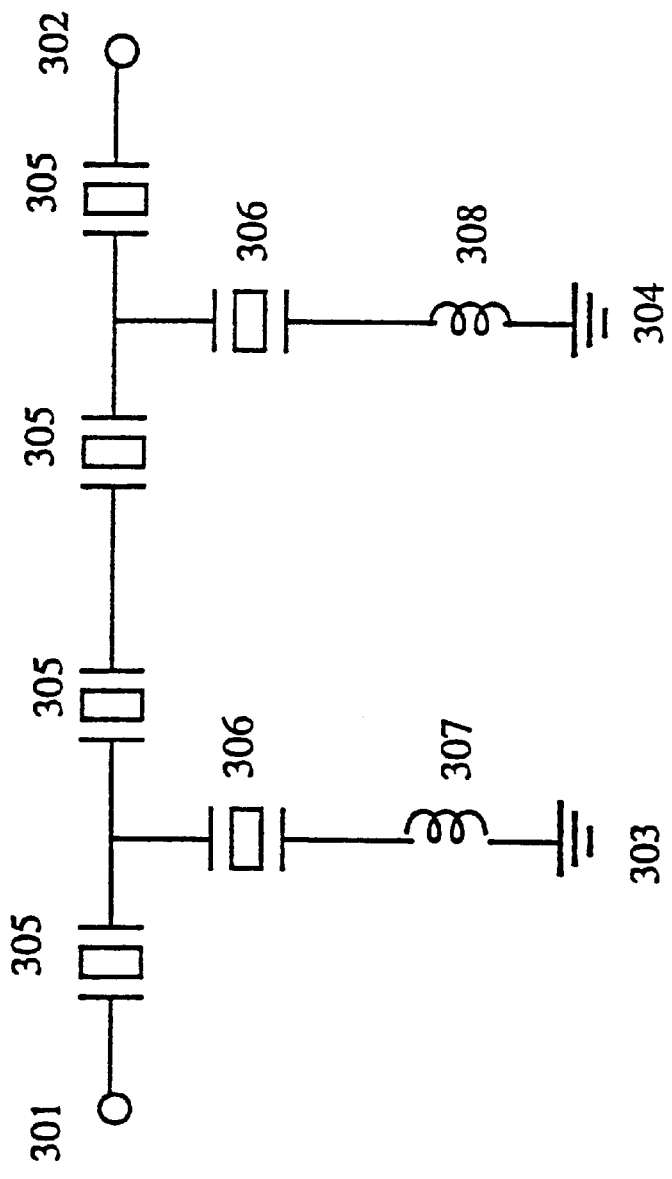
FIG. 11 shows the structure of a fourth embodiment of the high-frequency surface acoustic wave filter according to the present invention.
Figure 12:
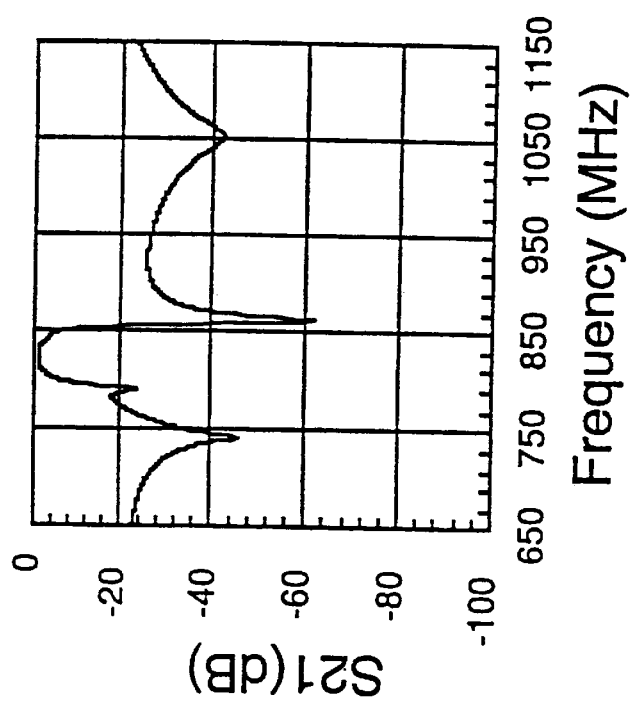
FIG. 12 shows frequency characteristics of the high-frequency surface acoustic wave filter in the fourth embodiment of the present invention.
Figure 13:
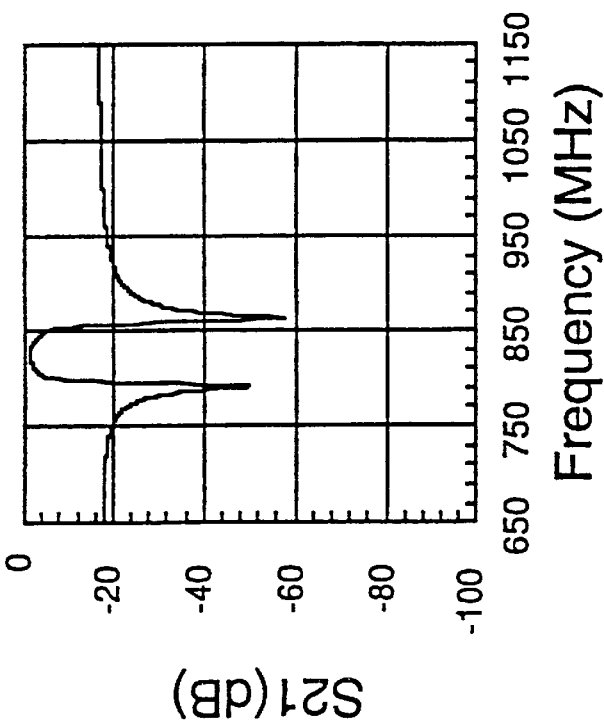
FIG. 13 shows frequency characteristics of the high-frequency surface acoustic wave filter in the fourth embodiment of the present invention.

Next, a fourth embodiment of the present invention will be described. A ladder-type filter was formed by using LiTaO$_3$ of 36-degree Y cut and X propagation as the piezoelectric substrate. In this embodiment, the ground terminals on the piezoelectric substrate are not connected on the piezoelectric substrate but are connected through an external ground terminal of the package on a board where the filter is finally mounted. The circuit structure of this filter is shown in FIG. 11. Reference numeral 301 represents an input terminal. Reference numeral 302 represents an output terminal. Reference numerals 303 and 304 represent ground terminals. Reference numeral 305 represents surface acoustic wave resonators connected in series. Reference numeral 306 represents surface acoustic wave resonators connected in parallel. Reference numerals 307 and 308 represent inductors respectively connected in series with the surface acoustic wave resonators connected in parallel. Since the ground terminals are connected on the finally mounted board, the inductors are generated in a simple manner compared with the case where the ground terminals are connected for commonality on the piezoelectric substrate, so that the inductors are easily adjusted. Characteristics of cases where the values of the inductors 307 and 308 are the same and different are shown in FIGS. 12 and 13, respectively.

Thus, the characteristics of the out-of-band attenuation may be changed by an easy adjustment of the values. To change the inductors, the length and size of the bonding wire or the via are changed. In the case of FIG. 3A, the length and size of the common connection are further changed. Thus, the inductors are easily adjusted.

While the number of ground terminals of the present invention is three in the above-described embodiments, more ground terminals may be provided, that is, any number of ground terminals may be provided as long as a plurality of ground terminals are provided.

(Fifth Embodiment)

Figure 14:
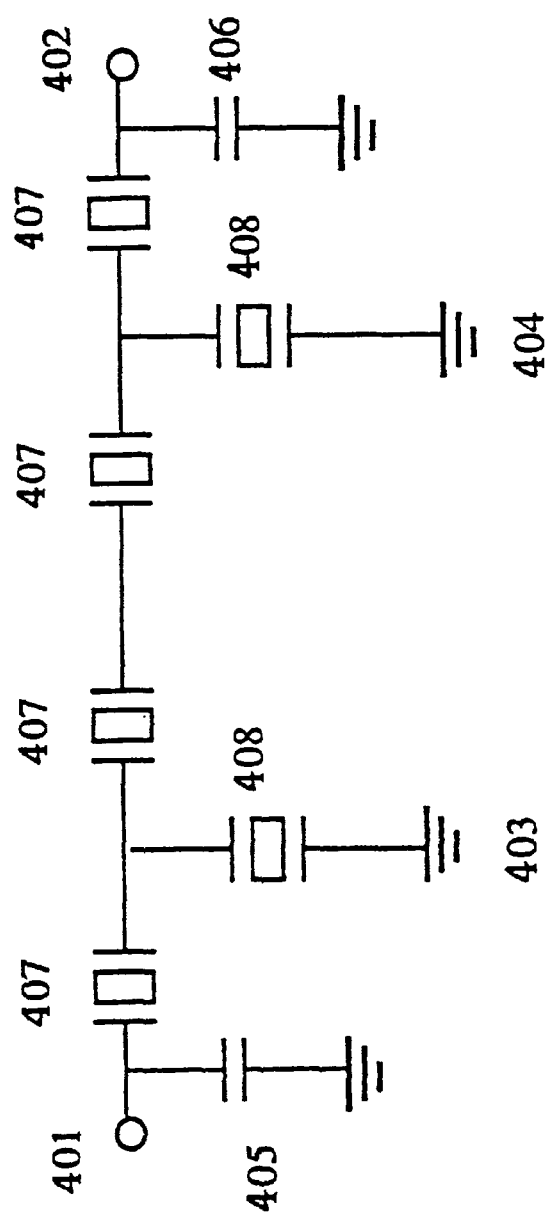
FIG. 14 shows the structure of a fifth embodiment of the high-frequency surface acoustic wave filter according to the present invention.

Next, a fifth embodiment of the present invention will be described. A ladder-type filter was formed by using an LiTaO$_3$ board of 36-degree Y cut and X propagation as the piezoelectric substrate. A schematic view of this filter is shown in FIG. 14. Reference numeral 401 represents an input terminal of the package. Reference numeral 402 represents an output terminal of the package. Reference numerals 403 and 404 represent ground terminals. Reference numeral 405 represents the capacitance between the signal line and the ground terminal on the input side. Reference numeral 406 represents the capacitance between the signal line and the ground terminal on the output side. Reference numeral 407 represents resonators connected in series. Reference numeral 408 represents resonators connected in parallel.

Figure 16:
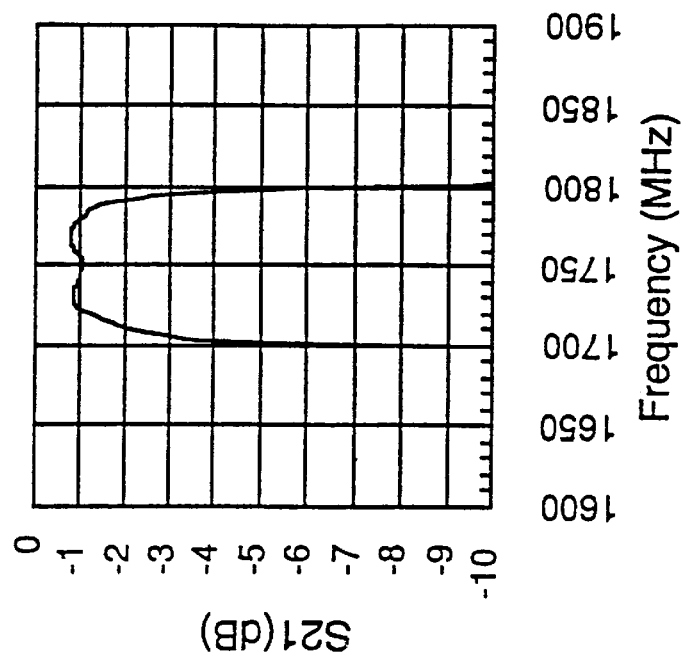
FIG. 16 shows an enlargement of the vicinity of the passband of FIG. 15.
Figure 15:
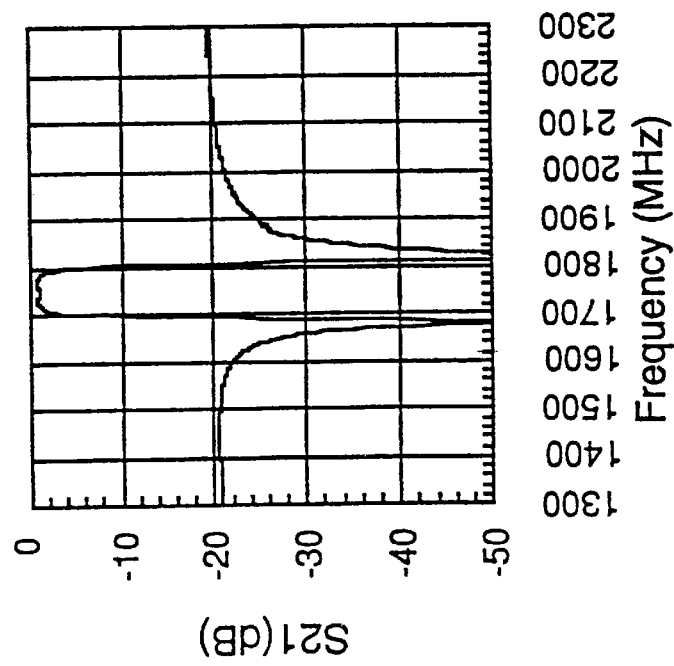
FIG. 15 shows theoretical frequency characteristics of the high-frequency surface acoustic wave filter in the fifth embodiment of the present invention.
Figure 18:
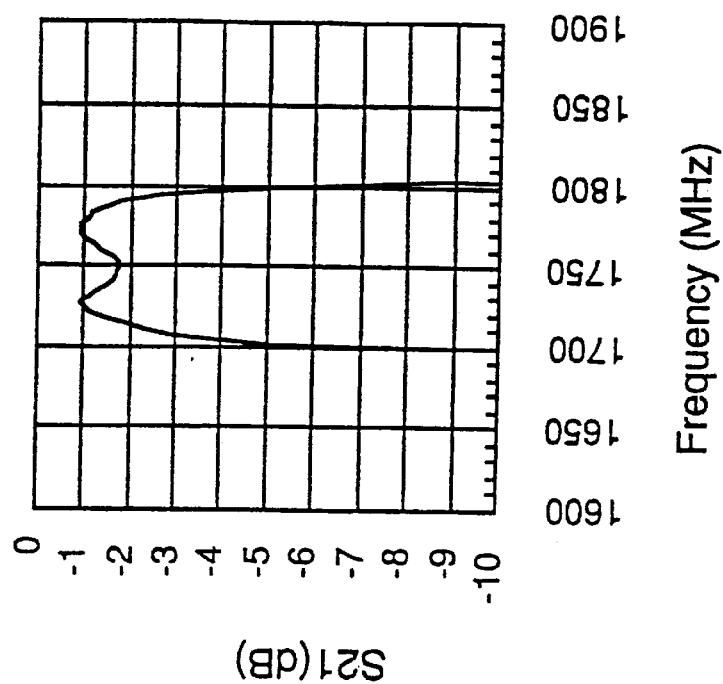
FIG. 18 shows an enlargement of the vicinity of the passband of FIG. 17.
Figure 17:
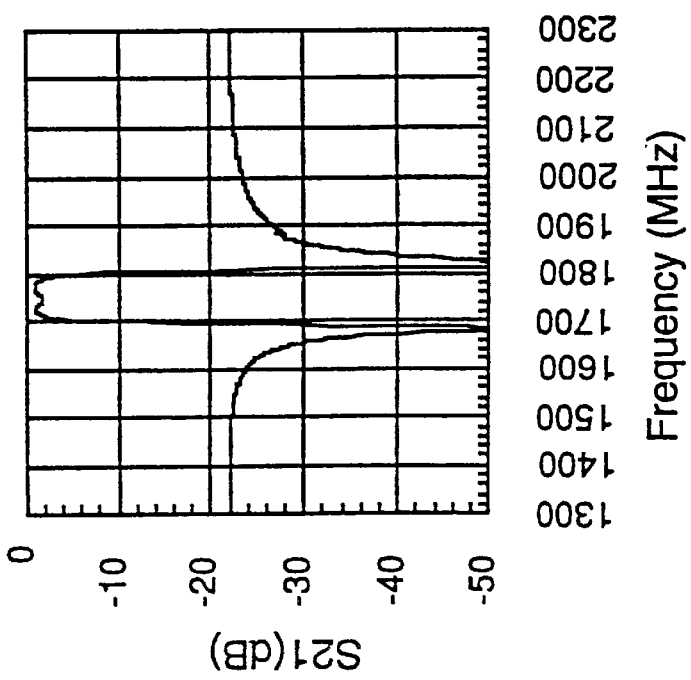
FIG. 17 shows frequency characteristics of the high-frequency surface acoustic wave filter in which a capacitance C is 0.4 pF in the fifth embodiment of the present invention.
Figure 20:
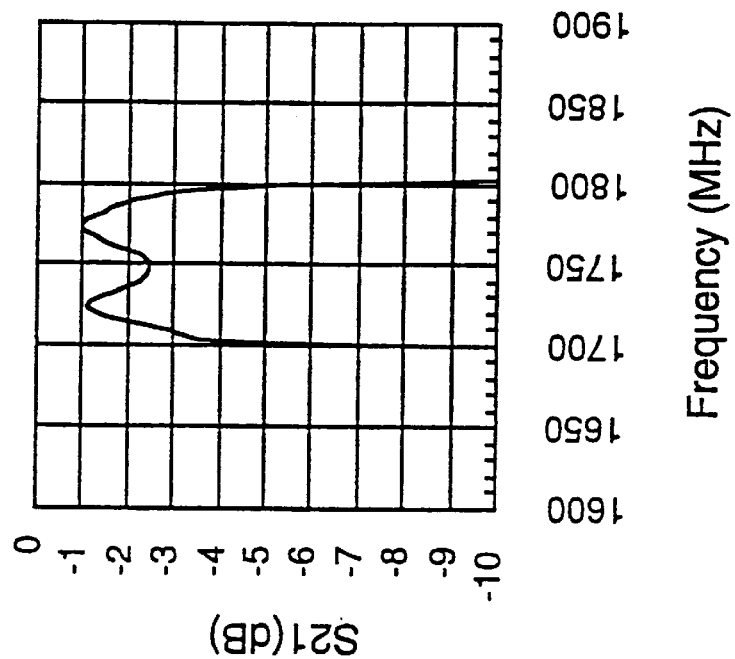
FIG. 20 shows an enlargement of the vicinity of the passband of FIG. 19.
Figure 19:
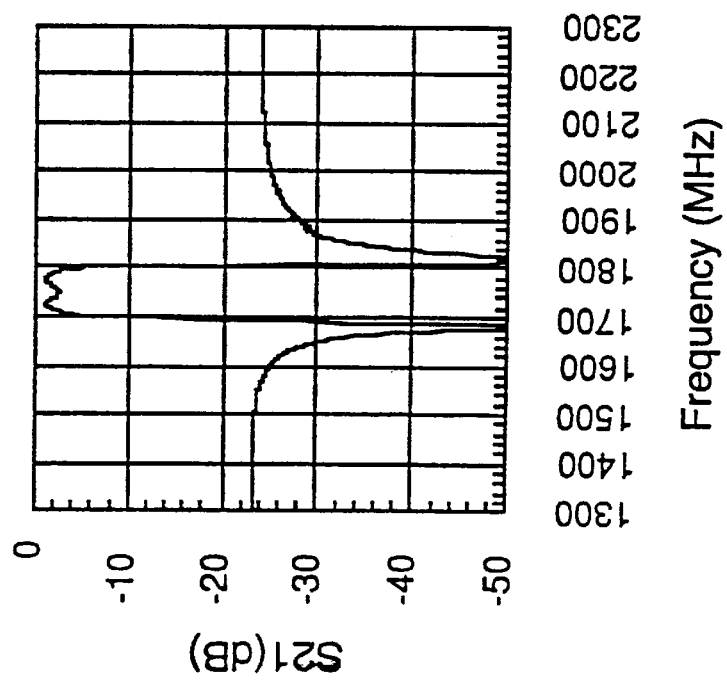
FIG. 19 shows frequency characteristics of the high-frequency surface acoustic wave filter in which the capacitance C is 0.7 pF in the fifth embodiment of the present invention.
Figure 22:
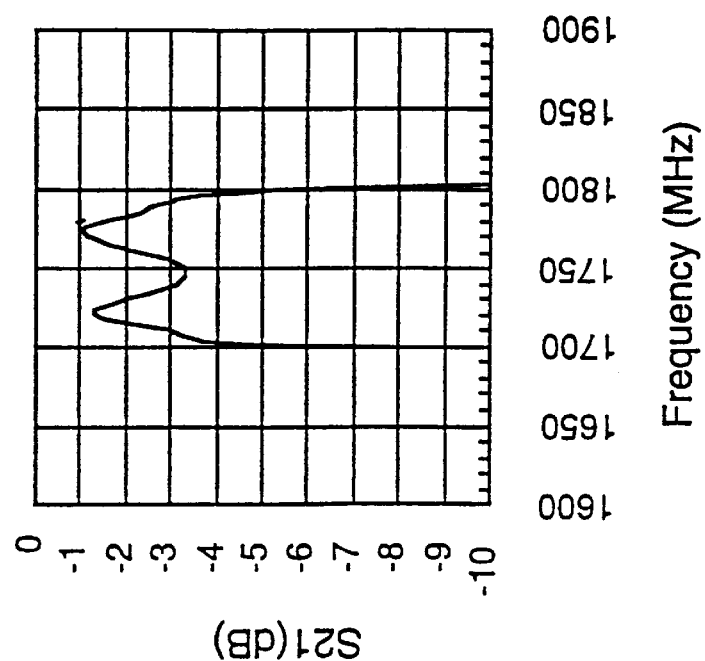
FIG. 22 shows an enlargement of the vicinity of the passband of FIG. 21.
Figure 21:
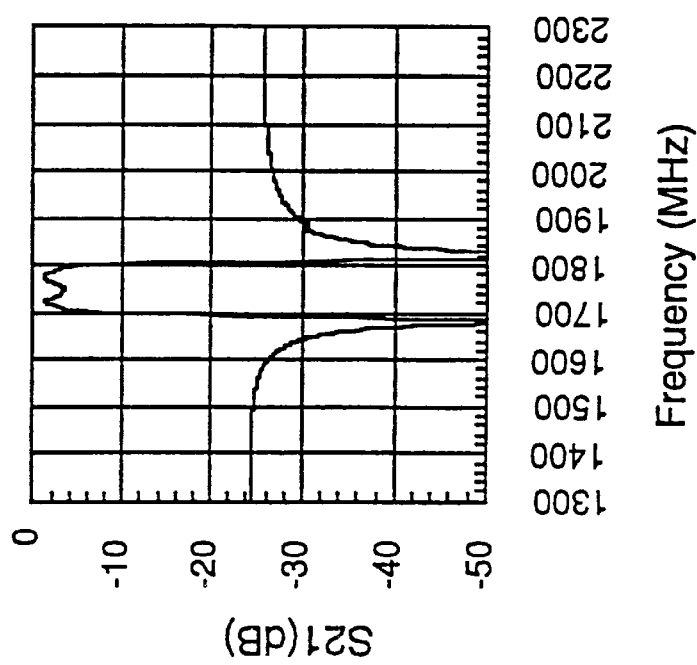
FIG. 21 shows frequency characteristics of the high-frequency surface acoustic wave filter in which the capacitance C is 1.0 pF in the fifth embodiment of the present invention.

A filter with a center frequency of 1.75 GHz was formed. Characteristics of a case where the signal line-ground terminal capacitance of this filter is 0 pF are shown in FIGS. 15 and 16. FIG. 16 shows an enlargement of the vicinity of the passband of FIG. 15. These characteristics are values obtained by simulation because they cannot be measured. The characteristics show a regular wave form. Characteristics of a case where the capacitances 405 and 406 are 0.4 pF, that is, a case where the left side of the expression 1 is 227.3 are shown in FIGS. 17 and 18. FIG. 18 shows an enlargement of the vicinity of the passband of FIG. 17. From these figures, it is apparent that the filter has characteristics being sufficiently fit for use although the ripple within the passband is great compared with that of FIG. 15. Characteristics of a case where the capacitances 405 and 406 are 0.7 pF, that is, a case where the left side of the expression 1 is substantially 130 are shown in FIGS. 19 and 20. FIG. 20 shows an enlargement of the vicinity of the passband of FIG. 19. It is apparent that compared with FIGS. 15 and 17, the characteristics are inferior and particularly, the ripple within the passband is approximately 1.5 dB which is the limit of the level being fit for use. Characteristics of a case where the capacitances 405 and 406 are 1.0 pF, that is, a case where the left side of the expression 1 is substantially 90.9 are shown in FIGS. 21 and 22. FIG. 22 shows an enlargement of the vicinity of the passband of FIG. 21. It is apparent that compared with FIGS. 15, 17 and 19, the characteristics are inferior and particularly, the ripple within the passband exceeds 2 dB which renders the filter difficult to use.

Figure 23:
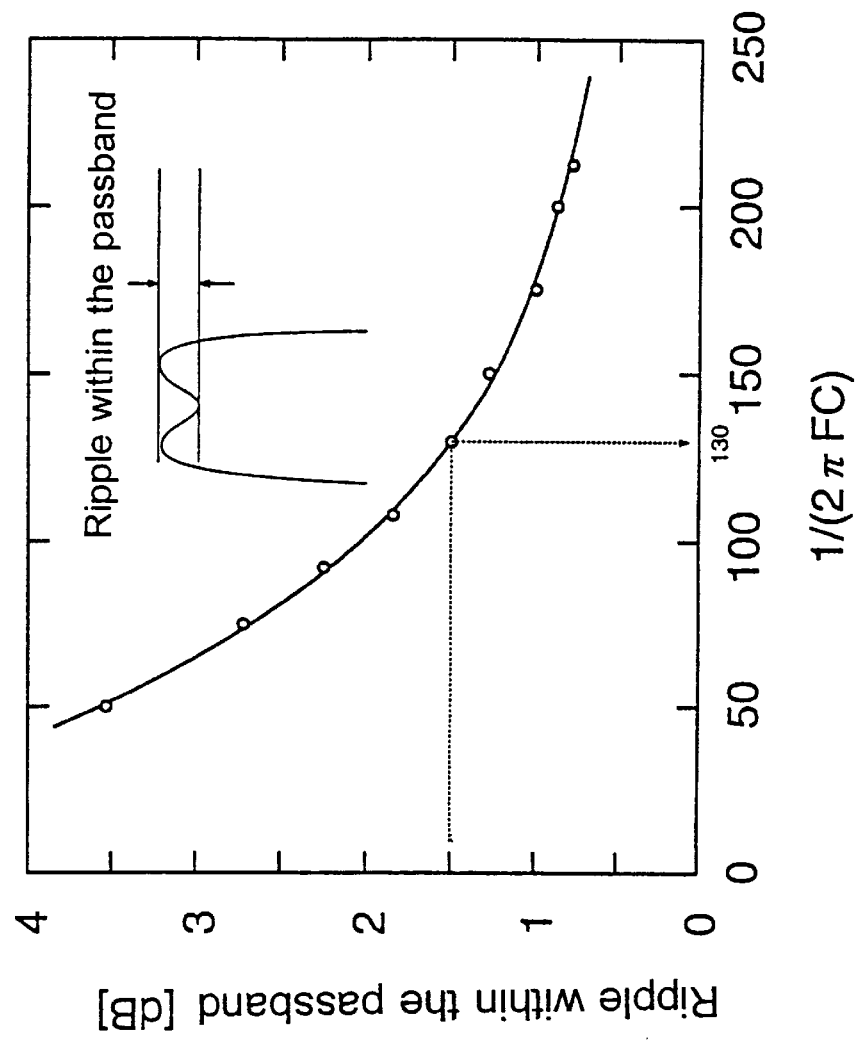
FIG. 23 shows a relationship among the center frequency, the signal line-ground terminal capacitance and the in-passband ripple of the high-frequency surface acoustic wave filter in the fifth embodiment of the present invention.
Figure 25:
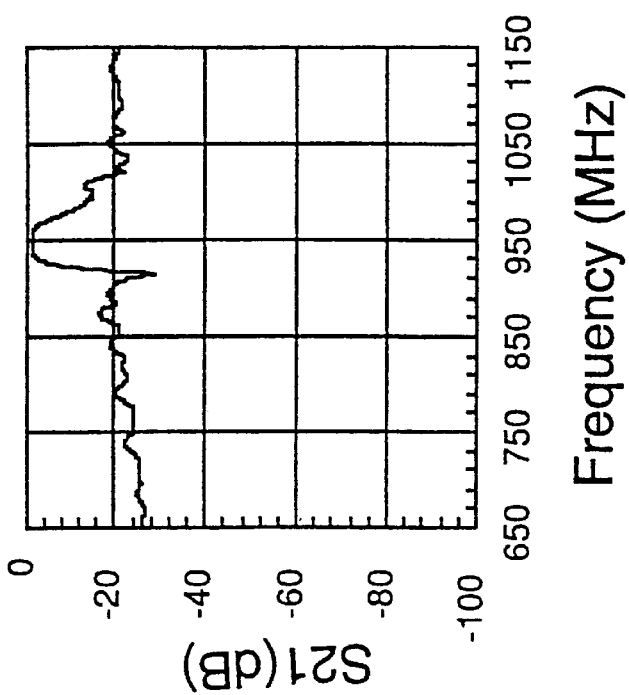
FIG. 25 shows frequency characteristics of a high-frequency surface acoustic wave filter according to a conventional structure.
Figure 24:
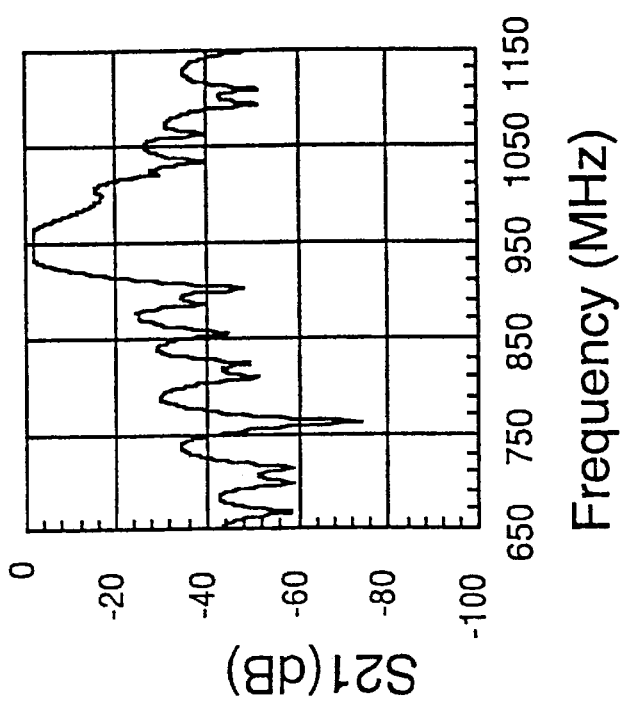
FIG. 24 shows theoretical frequency characteristics of a three-electrode longitudinal-mode-type filter with a center frequency of 950 MHz using an LiNbO$_3$ board of 64-degree Y cut and X propagation.
Figure 28:
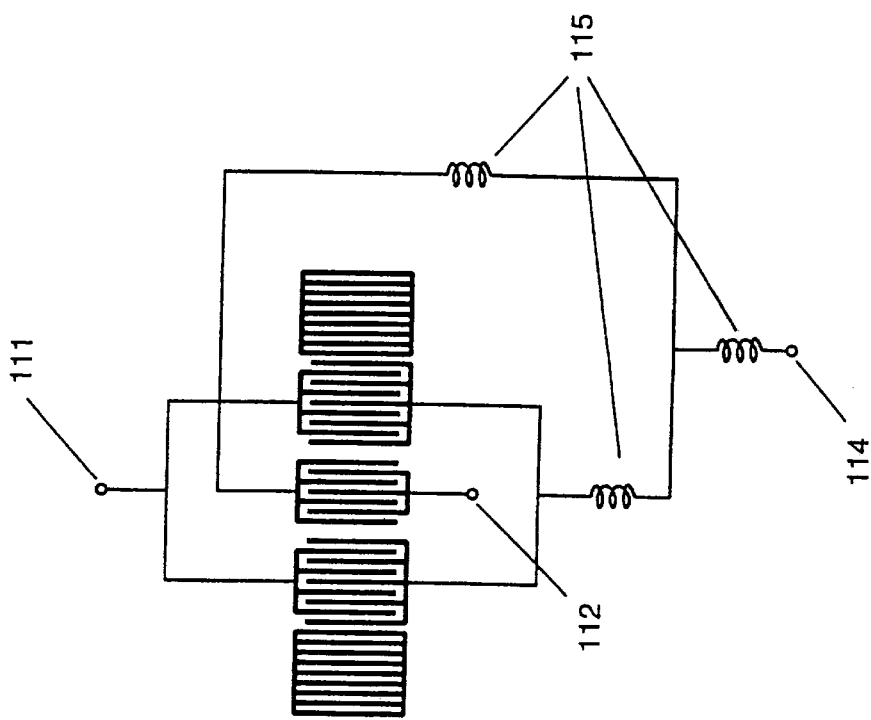
FIG. 28 shows a schematic illustration of the conventional high-frequency surface acoustic wave filter.

FIG. 23 shows results of detailed examinations on the relationship between the ripple within the passband and the value of the expression 1 with various center frequencies and signal line-ground terminal capacitances as the variables. As is apparent from FIG. 23, the value of the ripple within the passband continuously changes according to the value of the expression 1. Assuming that the in-passband ripple permissible in practical use is 1.5 dB, the limit for the value of the expression 1 is 130. When the value is higher than 130, the in-passband ripple is within the permissible range; however, when the value is lower than 130, the in-passband ripple is 1.5 dB or higher, so that the characteristics conspicuously deteriorate.

While LiTaO$_3$ of 36-degree Y cut and X propagation is used as the piezoelectric substrate in the above-described embodiments, any piezoelectric substrate may be used that produces the same effects. For example, crystal and LiNbO$_3$ of 41-degree Y cut and X propagation produce the same effects. For the electrodes, although not specified, aluminum and aluminum doped with copper produce the same effects.

For the filter type such as the ladder type, the embodiments of the present invention are all applicable to any type.

As is clear from the description given above, according to the present invention, a high-frequency surface acoustic wave filter may be produced which has characteristics closer to calculated values, so that the production accuracy may be improved.

Moreover, according to the present invention, high-frequency surface acoustic wave filters may be obtained which have the same piezoelectric substrate and comb electrode designs but have different out-of-band attenuation characteristics.

Further, according to the present invention, the influence of the parasitic components of the package containing the piezoelectric substrate may be grasped and a high-frequency surface acoustic wave filter designed in consideration of the influence may be produced, so that the production accuracy and characteristics of the high-frequency surface acoustic wave filter may be improved.

What is claimed is:

1. A ladder-type high-frequency surface acoustic wave filter in which a plurality of comb electrodes are formed on a piezoelectric substrate, said high-frequency surface acoustic wave filter comprising:

said piezoelectric substrate;

an input terminal;

an output terminal;

at least two ground terminals provided on said piezoelectric substrate; and a plurality of surface wave resonators disposed in a ladder-type arrangement with one of said resonators connected to said input terminal and another of said resonators connected to said output terminal, wherein said ground terminals are neither connected on said piezoelectric substrate nor connected in a package containing said piezoelectric substrate.

2. A ladder-type high-frequency surface acoustic wave filter in which a plurality of comb electrodes are formed on a piezoelectric substrate, said high-frequency surface acoustic wave filter comprising:

said piezoelectric substrate;

an input terminal;

an output terminal;

a plurality of surface wave resonators disposed in a ladder-type arrangement with one of said resonators connected to said input terminal and another of said resonators connected to said output terminal; and at least three ground terminals provided on said piezoelectric substrate, wherein a part of said ground terminals is neither connected on said piezoelectric substrate nor connected in a package containing said piezoelectric substrate, and a remainder of said ground terminals is connected on said piezoelectric substrate or in said package.

3. A high-frequency surface acoustic wave filter in which a plurality of comb electrodes are formed on a piezoelectric substrate, said high-frequency surface acoustic wave filter comprising:

said piezoelectric substrate;

an input terminal;

an output terminal; and at least two ground terminals provided on said piezoelectric substrate, wherein a part (A) of said ground terminals is neither connected on said piezoelectric substrate nor connected in a package containing said piezoelectric substrate, and a remainder (B) of said ground terminals is connected on said piezoelectric substrate or in said package, and wherein said part (A) includes a plurality of ground terminals, and wherein values of inductors respectively connected to said plurality of ground terminals are different from each other.

4. A high-frequency surface acoustic wave filter according to claim 3, wherein a relationship between a pass center frequency F in hertz (Hz) and a capacitance C in farads (F) existing between the ground terminals and the signal input and output terminals of the high-frequency surface acoustic wave filter is $$1/(2\pi FC) > 130.$$

5. A high-frequency surface acoustic wave filter in which a plurality of comb electrodes are formed on a piezoelectric substrate, said high-frequency surface acoustic wave filter comprising:

said piezoelectric substrate;

an input terminal;

an output terminal; and at least two ground terminals provided on said piezoelectric substrate, wherein said ground terminals are neither connected on said piezoelectric substrate nor connected in a package containing said piezoelectric substrate, and wherein a relationship between a pass center frequency F in hertz (Hz) and a capacitance C in farads (F) existing between the ground terminals and the signal input and output terminals of the high-frequency surface acoustic wave filter is $$1/(2\pi FC) > 130.$$

6. A high-frequency surface acoustic wave filter in which a plurality of comb electrodes are formed on a piezoelectric substrate, said high-frequency surface acoustic wave filter comprising:

said piezoelectric substrate;

an input terminal;

an output terminal; and at least two ground terminals provided on said piezoelectric substrate, wherein said ground terminals are neither connected on said piezoelectric substrate nor connected in a package containing said piezoelectric substrate, and wherein values of inductors respectively connected to said ground terminals are different from each other, and wherein a relationship between a pass center frequency F in hertz (Hz) and a capacitance C in farads (F) existing between the ground terminals and the signal input and output terminals of the high-frequency surface acoustic wave filter is $$1/(2\pi FC) > 130.$$

7. A high-frequency surface acoustic wave filter in which a plurality of comb electrodes are formed on a piezoelectric substrate, said high-frequency surface acoustic wave filter comprising:

said piezoelectric substrate;

an input terminal;

an output terminal;

at least two ground terminals provided on said piezoelectric substrate, wherein a part of said ground terminals is neither connected on said piezoelectric substrate nor connected in a package containing said piezoelectric substrate, and a remainder of said ground terminals is connected on said piezoelectric substrate or in said package, and wherein a relationship between a pass center frequency F in hertz (Hz) and a capacitance C in farads (F) existing between the ground terminals and the signal input and output terminals of the high-frequency surface acoustic wave filter is $1/(2\pi FC) > 130$.

* * * * *